(12) United States Patent
Nimbargi et al.

(10) Patent No.: US 8,022,700 B2
(45) Date of Patent: Sep. 20, 2011

(54) METHOD AND APPARATUS FOR VIEW ORDERING OF MAGNETIC RESONANCE IMAGING DATA FOR DYNAMIC STUDIES

(75) Inventors: Vijay Shivalingappa Nimbargi, Bangalore (IN); Ramesh Venkatesan, Bangalore (IN); Ersin Bayram, Delafield, WI (US); Anthony Tienhuan Vu, Waukesha, WI (US); Charles Robert Michelich, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 239 days.

(21) Appl. No.: 12/267,067

(22) Filed: Nov. 7, 2008

(65) Prior Publication Data

US 2010/0117644 A1    May 13, 2010

(51) Int. Cl.
*G01V 3/00* (2006.01)
(52) U.S. Cl. ...................................... 324/309
(58) Field of Classification Search ........... 324/300–322
See application file for complete search history.

(56) References Cited

U.S. PATENT DOCUMENTS

| | | | |
|---|---|---|---|
| 5,713,358 A | 2/1998 | Mistretta et al. | |
| 5,833,609 A * | 11/1998 | Dannels et al. | 600/410 |
| 6,639,211 B1 * | 10/2003 | Anand et al. | 250/282 |
| 6,882,148 B2 * | 4/2005 | Pipe | 324/307 |
| 7,023,207 B1 * | 4/2006 | Gaddipati et al. | 324/309 |
| 7,102,348 B2 * | 9/2006 | Zhang et al. | 324/309 |
| 7,265,546 B2 | 9/2007 | Kannengiesser et al. | |
| 7,265,547 B2 | 9/2007 | Vu | |
| 7,372,269 B2 * | 5/2008 | Takizawa et al. | 324/309 |

(Continued)

FOREIGN PATENT DOCUMENTS

| WO | 2004081597 A1 | 9/2004 |
|---|---|---|
| WO | 2006119164 A2 | 11/2006 |

OTHER PUBLICATIONS

Hu et al., The Combination of 2D SENSE and 2D Partial Fourier Homodyne Reconstruction: Achieving Accelartion Factors Greater Than the Number of Coils, Proc. Intl. Soc. Mag. Reson. Med. 14 (2006).

Haider et al., Time-Resolved 3D Contrast-Enhanced MRA with 2D Homodyne and View Sharing for Contrast Bolus Dynamics of the Brain, Proc. Intl. Soc. Mag. Reson. Med. 14 (2006).

(Continued)

*Primary Examiner* — Dixomara Vargas (57) ABSTRACT

A method for acquiring magnetic resonance (MR) data for a three-dimensional (3D) dynamic study includes partitioning a $k_y$-$k_z$ plane with a plurality of views into an inner region and a plurality of outer regions. The inner region includes a set of views in a central region of the $k_y$-$k_z$ plane and each outer region includes a plurality of views outside of the central region of the $k_y$-$k_z$ plane. The method also includes partitioning each outer region into a plurality of radial fan beam segments, defining a first view ordering for the inner region and defining a second view ordering for each outer region. Once the $k_y$-$k_z$ plane is partitioned and the view orderings are defined, MR data is acquired for the set of views in the inner region and for all of the views in each of the outer regions in an alternating acquisition order where the set of views in the inner region are acquired more frequently than the views in each of the outer regions. At least one MR image is generated based on the acquired MR data.

21 Claims, 6 Drawing Sheets

U.S. PATENT DOCUMENTS

| | | | |
|---|---|---|---|
| 7,535,222 B2 * | 5/2009 | Bammer et al. | 324/307 |
| 7,570,054 B1 * | 8/2009 | Lin | 324/309 |
| 7,728,588 B2 * | 6/2010 | Feiweier | 324/309 |
| 7,797,031 B1 * | 9/2010 | Foo | 600/410 |
| 2003/0011368 A1 | 1/2003 | Abe | |
| 2005/0073303 A1 | 4/2005 | Harer et al. | |
| 2006/0208730 A1 | 9/2006 | Kozerke et al. | |

OTHER PUBLICATIONS

Hu et al., Parallel Imaging with Partial Fourier Acquisitions for 3D MRI, Proc. Intl. Soc. Mag. Reson. Med. 13 (2005).

Bernstein et al., Effect of Windowing and Zero-Filled Reconstruction of MRI Data on Spatial Resolution and Acquisition Strategy, Journal of Magnetic Resonance Imaging 14:270-280 (2001), Wiley-Liss, Inc.

* cited by examiner

METHOD AND APPARATUS FOR VIEW ORDERING OF MAGNETIC RESONANCE IMAGING DATA FOR DYNAMIC STUDIES

TECHNICAL FIELD

The present invention relates generally to magnetic resonance imaging (MRI) systems and in particular, to a method and apparatus for view-ordering in a dynamic or time-resolved three-dimensional (3D) MRI data acquisition.

BACKGROUND

Magnetic resonance imaging (MRI) is a medical imaging modality that can create images of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z axis," by convention). A MRI system also comprises components called gradient coils that produce smaller amplitude, spatially varying magnetic fields when current is applied to them. Typically, gradient coils are designed to produce a magnetic field component that is aligned along the z axis and that varies linearly in amplitude with position along one of the x, y or z axes. The effect of a gradient coil is to create a small ramp on the magnetic field strength, and concomitantly on the resonance frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. These coils are used to add energy to the nuclear spin system in a controlled fashion. As the nuclear spins then relax back to their rest energy state, they give up energy in the form of an RF signal. This signal is detected by the MRI system and is transformed into an image using a computer and known reconstruction algorithms.

MRI data may be acquired using a three-dimensional (3D) acquisition strategy, the most common of which is a rectilinear sampling that fills a 3D Cartesian grid with Fourier reciprocal space (i.e., "k-space") data. The data may be collected with Nyquist frequency sampling to provide unique location encoding of the MRI signals and thereby prevent aliasing in the reconstructed images. The 3D data is spatially encoded using phase encoding along two perpendicular spatial directions (the y and z directions) and frequency encoding along the third (the x direction). Usually, the secondary phase encoding is referred to as "slice encoding," to distinguish it from the primary phase-encoding. The resultant raw data fills a 3D k-space matrix which is then "reconstructed" using Fourier transformation techniques, resulting in a stack of two-dimensional images.

MRI data is typically collected in frames that are referred to as "views." For 3D imaging, each view corresponds to a single $k_y$ and $k_z$ value, but contains data for the full range of $k_x$ values that are required to reconstruct an image. Multiple view-ordering schemes are known in the art for determining how $k_y$, $k_z$ encoding is performed for each view. For example, in a "nested" view-ordering scheme, all of the views corresponding to one phase-encoding axis ($k_z$, for example) are acquired before incrementing the value on the other phase-encoding axis ($k_y$, for example). An "elliptical centric" view-ordering scheme replaces the two nested loops with a single loop that steps through $k_y$, $k_z$ pairs according to their distance from the origin in the $k_y$-$k_z$ plane. The choice of a view-ordering scheme often depends on how the imaged object or its corresponding magnetization is expected to change during the data acquisition. Views near the center of k-space have the strongest effect on the overall image appearance, because most of the k-space information about an object is contained near the center of k-space.

Dynamic or time-resolved MR studies (or acquisitions) have been developed to image dynamic or time-varying processes (e.g., cardiac motion, multi-phase scans, contrast enhancement (e.g., vascular contrast), joint motion, catheter tracking, etc.) and typically involve repeatedly collecting the same data over time. View ordering techniques have been developed for encoding views in a dynamic or time-resolved acquisition, for example, keyhole techniques such as TRICKS (Time Resolved Imaging of Contrast Kinetics) and BRISK (Block Regional Interpolation Scheme for K-Space) that divide k-space into multiple regions and repeatedly update data in the center of k-space more frequently than other parts of k-space. Such techniques, however, can result in eddy current induced artifacts due to intra- and inter-region jumps in k-space during the acquisition. It would be desirable to provide a method and apparatus for acquiring MRI data for a dynamic or time-resolved acquisition that minimizes intra- and inter-region jumps and reduces eddy current induced artifacts.

BRIEF DESCRIPTION OF THE INVENTION

In accordance with an embodiment, a method for acquiring magnetic resonance (MR) data for a three-dimensional (3D) dynamic study includes partitioning a $k_y$-$k_z$ plane comprising a plurality of views into an inner region and a plurality of outer regions, the inner region comprising a set of views in a central region of the $k_y$-$k_z$ plane and each outer region comprising a plurality of views outside of the central region of the $k_y$-$k_z$ plane, partitioning each outer region into a plurality of radial fan beam segments, defining a first view ordering for the inner region, defining a second view ordering for each outer region acquiring MR data for the set of views in the inner region and for all of the views in each of the outer regions in an alternating acquisition order comprising acquiring the set of views in the inner region more frequently than the views in each of the outer regions and generating at least one MR image based on the acquired MR data.

In accordance with another embodiment, a computer readable medium having computer executable instructions for performing a method for acquiring magnetic resonance (MR) data for a three-dimensional (3D) dynamic study includes program code for partitioning a $k_y$-$k_z$ plane comprising a plurality of views into an inner region and a plurality of outer regions, the inner region comprising a set of views in a central region of the $k_y$-$k_z$ plane and each outer region comprising a plurality of views outside of the central region of the $k_y$-$k_z$ plane, program code for partitioning each outer region into a plurality of radial fan beam segments, program code for defining a first view ordering for the inner region, program code for defining a second view ordering for each outer region, program code for acquiring MR data for the set of views in the inner region and for all of the views in each of the outer regions in an alternating acquisition order comprising acquiring the set of views in the inner region more frequently than the views in each of the outer regions and program code for generating at least one MR image based on the acquired MR data.

In accordance with another embodiment, an apparatus for acquiring magnetic resonance (MR) data for a three-dimensional (3D) dynamic study includes a magnetic resonance imaging assembly comprising a magnet, a plurality of gradient coils, at least one radio frequency coil, a radio frequency transceiver system and a pulse generator module and a controller coupled to the magnetic resonance imaging assembly and programmed to control the magnetic resonance imaging assembly to acquire magnetic resonance data using a 3D pulse sequence. The controller is further programmed to partition a $k_y$-$k_z$ plane comprising a plurality of views into an inner region and a plurality of outer regions, the inner region comprising a set of views in a central region of the $k_y$-$k_z$ plane and each outer region comprising a plurality of views outside of the central region of the $k_y$-$k_z$ plane, partition each outer region into a plurality of radial fan beam segments, define a first view ordering for the inner region, define a second view ordering for each outer region, provide commands to the magnetic resonance imaging assembly to acquire MR data for the set of views in the inner region and for all of the views in each of the outer regions, encode the MR data for the set of views in the inner region and the views in each of the outer regions in an alternating acquisition order comprising acquiring the set of views in the inner region more frequently than the views in each of the outer regions and generate at least one MR image based on the acquired MR data.

BRIEF DESCRIPTION OF THE DRAWINGS

Embodiments are illustrated by way of example and not limitation in the figures of the accompanying drawings, in which like reference numerals indicate corresponding, analogous or similar elements, and in which.

DETAILED DESCRIPTION

In the following detailed description, numerous specific details are set forth in order to provide a thorough understanding of embodiments. However it will be understood by those of ordinary skill in the art that the embodiments may be practiced without these specific details. In other instances, well-known methods, procedures, components and circuits have not been described in detail so as not to obscure the embodiments.

A method and apparatus for acquiring magnetic resonance (MR) data for a three-dimensional (3D) dynamic study includes a view ordering technique that includes partitioning k-space into an inner region and a plurality of outer regions. The inner region comprises a plurality of views in a central region of k-space. Each outer region contains a plurality of views outside of the inner region. Each outer region is partitioned into a plurality of radial fan beam segments or blades. The inner region and the outer regions are acquired on an alternating acquisition order (e.g., a keyhole or TRICKS acquisition order) such that the inner region is acquired more frequently than the outer regions. The views of the fan beam segments of each outer region are acquired using, a view order such as center-in, center-out or a combination of center-in/center-out. By acquiring each outer region as a plurality of fan beam segments, inter- and intra-region jumps (e.g., gradient amplitude jumps or ($k_y$, $k_z$) co-ordinate jumps) during the acquisition may be reduced, minimized or eliminated. Accordingly, eddy current effects (e.g., induced artifacts) are also minimized. In addition, the view ordering technique provides increased time resolution of high spatial frequency components in the outer regions.

Figure 1:
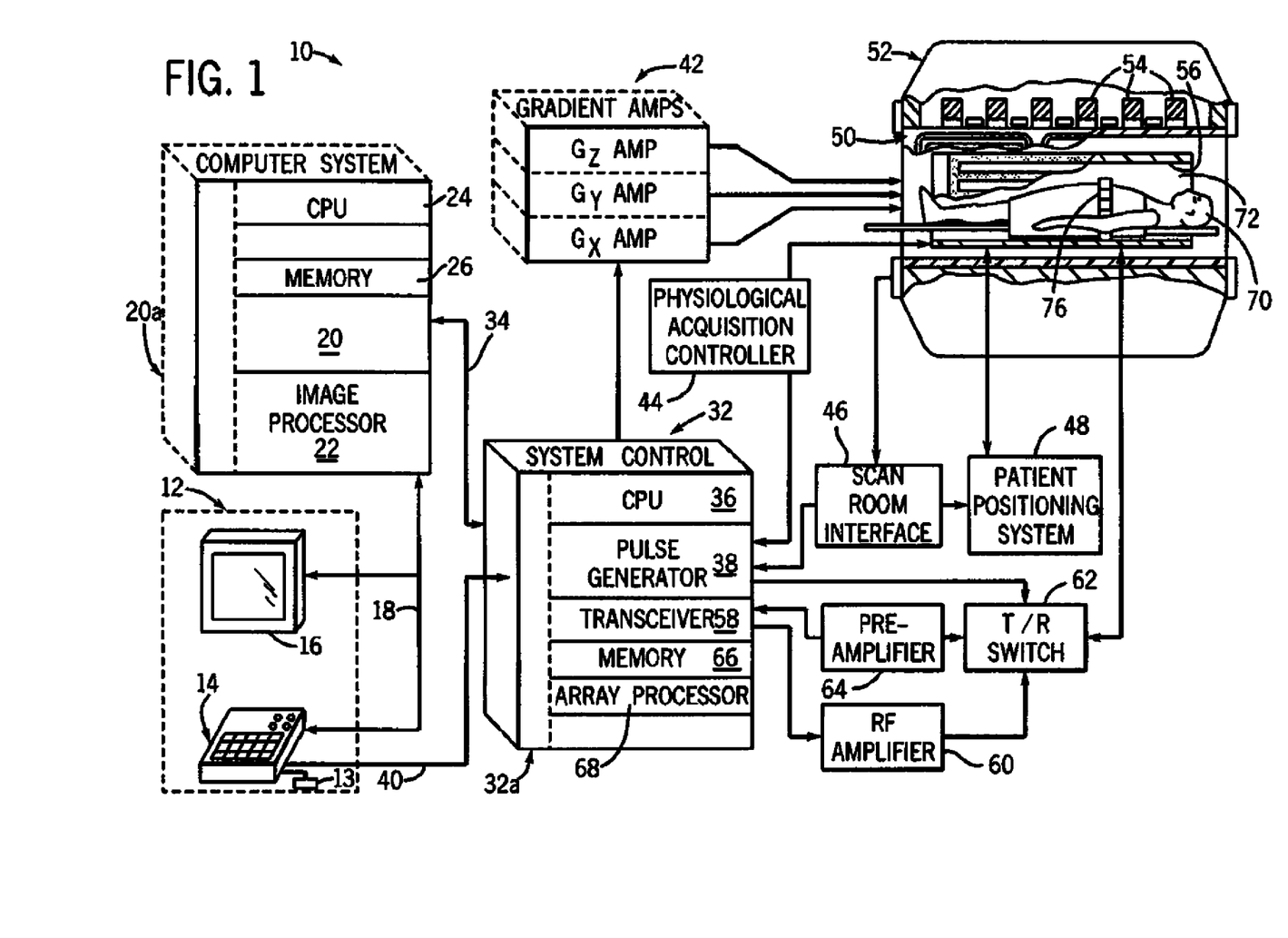
FIG. 1 is a schematic block diagram of an exemplary magnetic resonance imaging system in accordance with an embodiment.

FIG. 1 is a schematic block diagram of an exemplary magnetic resonance imaging system in accordance with an embodiment. The operation of MRI system 10 is controlled from an operator console 12 that includes a keyboard or other input device 13, a control panel 14 and a display 16. The console 12 communicates through a link 18 with a computer system 20 and provides an interface for an operator to prescribe MRI scans, display the resultant images, perform image processing on the images, and archive data and images. The computer system 20 includes a number of modules that communicate with each other through electrical and/or data connections, for example such as are provided by using a backplane 20a. Data connections may be direct wired links or may be fiber optic connections or wireless communication links or the like. The modules of computer system 20 may include an image processor module 22, a CPU module 24 and a memory module 26 that may include a frame buffer for storing image data arrays. In an alternative embodiment, the image processor module 22 may be replaced by image processing functionality on the CPU module 24. The computer system 20 is linked to archival media devices, permanent or back-up memory storage or a network. Computer system 20 may also communicate with a separate system control computer 32 through a link 34. The input device 13 can include a mouse, joystick, keyboard, track ball, touch activated screen, light wand, voice control, or any similar or equivalent input device, and may be used for interactive geometry prescription.

The system control computer 32 includes a set of modules in communication with each other via electrical and/or data connections 32a. Data connections 32a may be direct wired links, or may be fiber optic connections or wireless communication links or the like. In alternative embodiments, the modules of computer system 20 and system control computer 32 may be implemented on the same computer systems or a plurality of computer systems. The modules of system control computer 32 include a CPU module 36 and a pulse generator module 38 that connects to the operator console 12 through a communications link 40. The pulse generator module 38 may alternatively be integrated into the scanner equipment (e.g., resonance assembly 52). It is through link 40 that the system control computer 32 receives commands from the operator to indicate the scan sequence that is to be performed. The pulse generator module 38 operates the system components that play out (i.e., perform) the desired pulse sequence by sending instructions, commands and/or requests describing the timing, strength and shape of the RF pulses and pulse sequences to be produced and the timing and length of the data acquisition window. The pulse generator module 38 connects to a gradient amplifier system 42 and produces data called gradient waveforms which control the timing and shape of the gradient pulses that are to be used during the scan. The pulse generator module 38 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to gradient amplifier system 42 which is comprised of Gx, Gy and Gz amplifiers. Each gradient amplifier excites a corresponding physical gradient coil in a gradient coil assembly generally designated 50 to produce the magnetic field gradient pulses used for spatially encoding acquired signals. The gradient coil assembly 50 forms part of a resonance assembly 52 that includes a polarizing magnet 54 and a whole-body RF coil 56, surface or parallel imaging coils 76 or both. The coils 56, 76 may be configured for both transmitting and receiving or for transmit-only or receive-only. A patient or imaging subject 70 may be positioned within a cylindrical patient imaging volume 72 of the resonance assembly 52. A transceiver module 58 in the system control computer 32 produces pulses that are amplified by an RF amplifier 60 and coupled to the RF coils 56, 76 by a transmit/receive switch 62. The resulting signals emitted by the excited nuclei in the patient may be sensed by the same RF coil 56 and coupled through the transmit/receive switch 62 to a preamplifier 64. Alternatively, the signals emitted by the excited nuclei may be sensed by separate receive coils such as parallel or surface coils 76. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the coil during the receive mode. The transmit/receive switch 62 can also enable a separate RF coil (for example, a parallel or surface coil 76) to be used in either the transmit or receive mode.

The MR signals sensed by the RF coil 56 or surface coil 76 are digitized by the transceiver module 58 and transferred to a memory module 66 in the system control computer 32. Three dimensional (3D) MRI data is typically collected in a 3D Fourier space known in imaging as "k-space," a reciprocal space connected to real space via a Fourier transform. Typically, each MR signal, or "view," is encoded with a particular spatial frequency using "phase-encoding" and "slice-encoding" gradient pulses. For example, in a 3D Cartesian acquisition of MRI data, two directional phase encodings may be performed that correspond to a phase-encoding axis ($k_y$) and a slice-encoding axis ($k_z$). K-space is sampled by acquiring multiple phase-and slice-encoded views, each of which is defined by a unique $k_y$, $k_z$ position in the $k_y$-$k_z$ plane. Each view may acquire all the $k_x$ data for a specific pair of phase-encoding and slice-encoding values (i.e., each view may acquire all of the $k_x$ data required for its $k_y$, $k_z$ position). Multiple such digitized views are stored temporarily in the memory module 66 until they are subsequently transformed to create images. An array processor 68 uses a known transformation method, most commonly a Fourier transform, to create images from the MR signals. These images are communicated through the link 34 to the computer system 20 where it is stored in memory. In response to commands received from the operator console 12, this image data may be archived in long term storage or it may be further processed by the image processor 22 and conveyed to the operator console 16 and presented on display 16.

Figure 2:
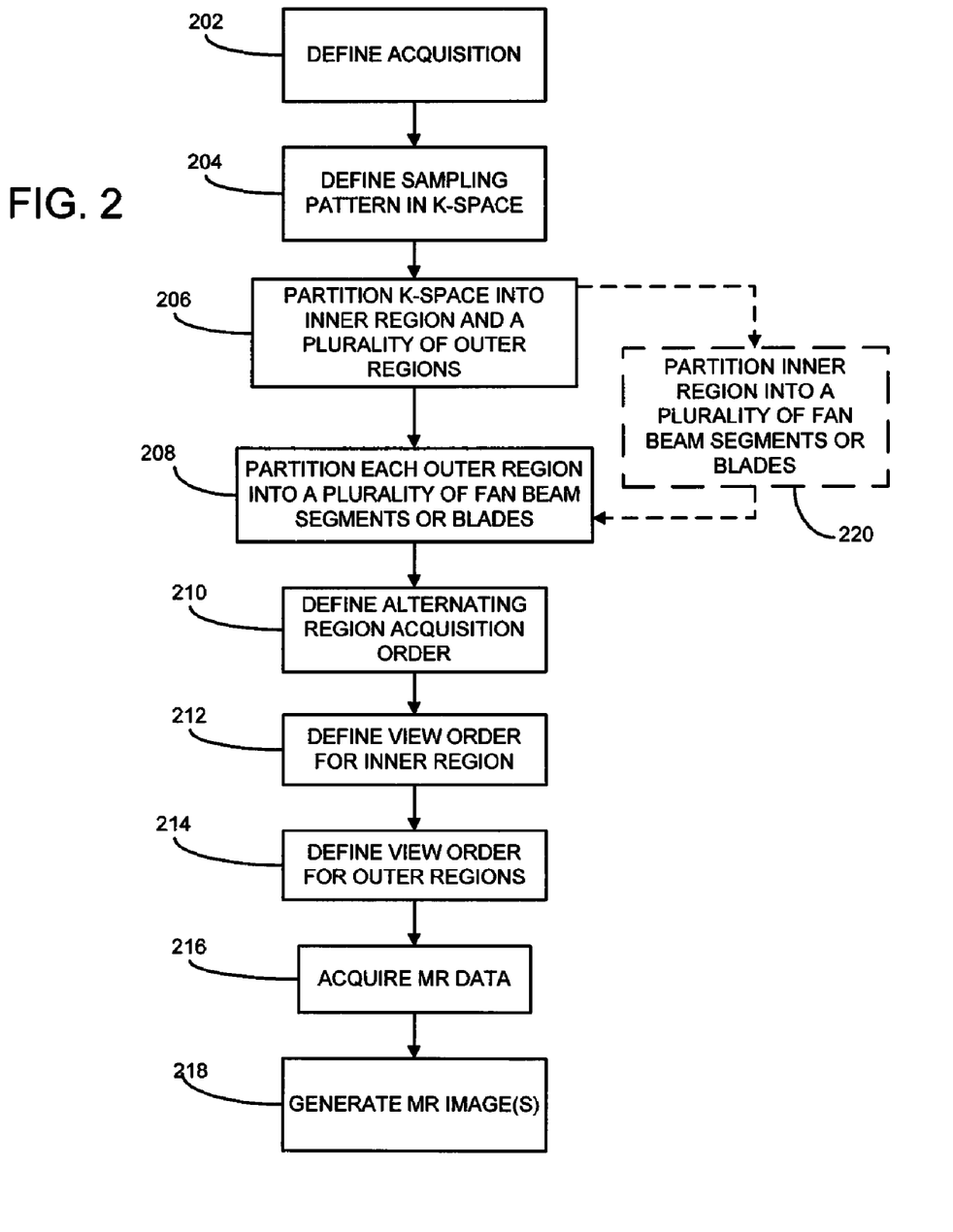
FIG. 2 illustrates a method for acquiring three-dimensional (3D) MRI data for a dynamic study including a view ordering technique in accordance with an embodiment.

As mentioned, multiple views may be acquired, e.g., using an MRI system such as described above with respect to FIG. 1, and transformed to create images. FIG. 2 illustrates a method for acquiring three-dimensional (3D) MRI data for a dynamic study including a view ordering technique in accordance with an embodiment. The method may be implemented using an MRI system such as described above with respect to FIG. 1 or any similar or equivalent system for obtaining MR images. For example, the view ordering technique may be part of a pulse sequence that is executed on the MRI system. At bock 202, a 3D acquisition is defined by selecting a pulse sequence and by identifying (e.g., by a user) various scan parameters (as appropriate for the particular acquisition), for example, field of view, matrix size, train length, shot length, number of shots and acceleration factor. Preferably, the selected pulse sequence is compatible with a dynamic or time-resolved study. Based on the various scan parameters, a sampling pattern in k-space (e.g., in the $k_y$-$k_z$ plane) is defined at block 204. The sampling pattern may be a uniform or variable density sampling pattern. The location of each view in the sampling pattern in the $k_y$-$k_z$ plane may be described by a coordinate pair ($k_y$, $k_z$). In addition, each view has a polar angle, θ, relative to the $k_z$ axis and a radial distance, r, from the center (i.e., the point (0,0)) of k-space.

Figure 3:
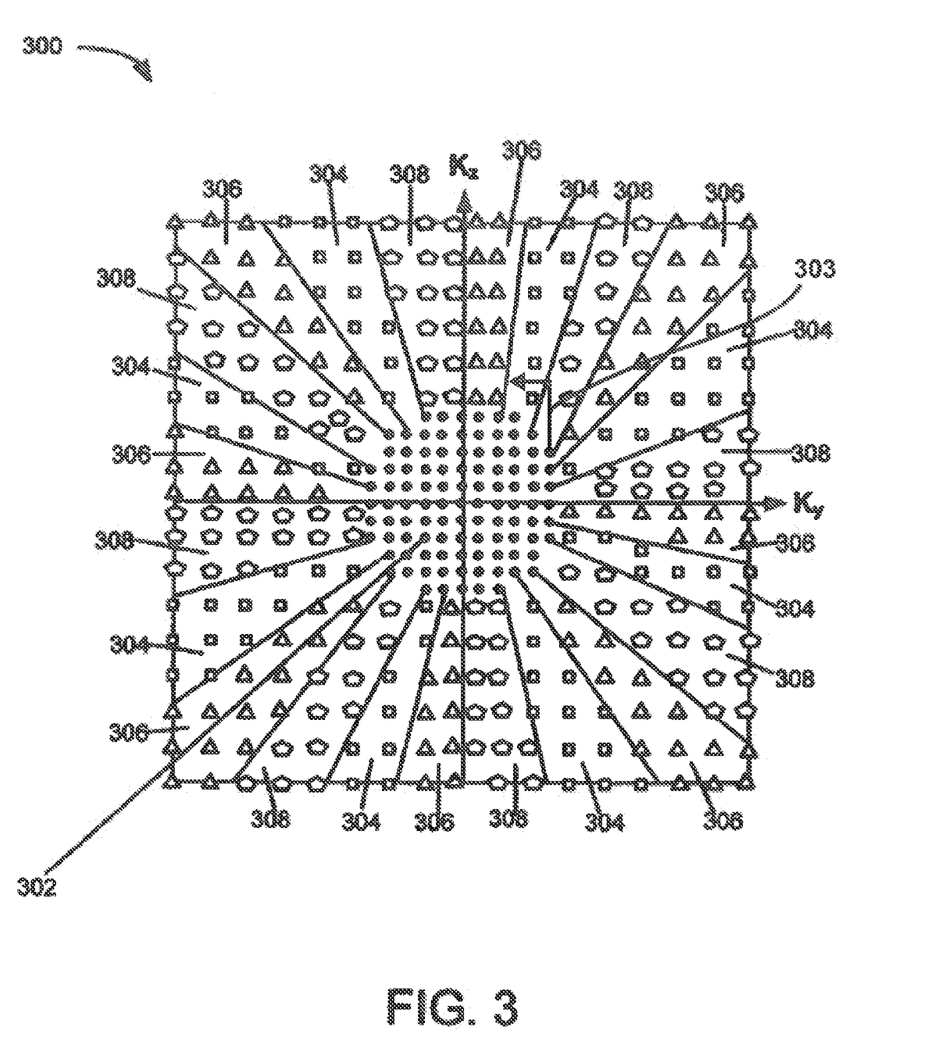
FIG. 3 is a schematic diagram showing a segmentation/partitioning of a $k_y$-$k_z$ plane in accordance with an embodiment.

At block 206, the $k_y$-$k_y$ plane is partitioned (or segmented) into an inner or central region of k-space and a plurality of outer regions of k-space. At block 208, each of the plurality of outer regions is partitioned (or segmented) into a plurality of fan beam segments or blades. FIG. 3 is a schematic diagram showing a segmentation of a $k_y$-$k_x$ plane in accordance with an embodiment. The k-space sampling pattern 300 is partitioned into an inner region 302 and a plurality of outer regions 304, 306 and 308. A greater or lesser number of outer regions may be used. Preferably, at least two outer regions are used. The inner region ("A") 302 contains the origin of the $k_y$-$k_z$ plane (or center of k-space) and views near the origin of the $k_y$-$k_z$ plane. The views in the inner or central region 302 contain low frequency information about an imaged object. In FIG. 3, views in the inner region 302 are represented with circles. Each outer region 304, 306, 308 contains views outside the inner region 302 and farther from the center of k-space. A first outer region ("B") 304 is divided into a plurality of fan beam segments or blades. In FIG. 3, views in the first outer region 304 are represented with squares. A second outer region ("C") 306 is divided into a plurality of fan beam segments or blades. In FIG. 3, views in the second outer region 306 are represented with triangles. A third outer region ("D") 308 is divided into a plurality of fan beam segments or blades. In FIG. 3, views in the third outer region 308 are represented with pentagons. Each fan beam segment of an outer region has a thickness of $Nk_x$ (the total number of $k_x$ points for each view) and is bounded by two radial lines at polar angles $θ_{n1}$ and $θ_{n2}$, where n labels the segment or blade number.

In FIG. 3, each outer region 304, 306, 308 is divided into eight fan beam segments. A greater or lesser number of fan beam segments may be used. In one embodiment, the number of views in each region B 304, C 306 and D 308 is the same, however, in alternative embodiments, the number of views can vary in each outer region. The desired size of each fan beam segment in an outer region is based on the desired number of views per segment. In on embodiment, each segment or blade in a region has the same size or number of views, however, in other embodiments, one or more blades in a region may have more views that the other blades. The following description will discuss the view ordering technique with reference to the exemplary k-space grid shown in FIG. 3. The view ordering technique is also compatible with non-rectangular k-space grids (e.g., elliptical k-space grids), parallel imaging auto-calibration regions and to acquisitions without parallel imaging. In addition, the size of the grid 300 and the number of views shown in FIG. 3 are exemplary and for illustration only.

Returning to FIG. 2, at block 210, an alternating acquisition order or sequence for the inner and outer regions is defined. The alternating region acquisition order can be, for example, selected by a user or defined as part of the pulse sequence selected at block 202. The alternating acquisition sequence is configured to acquire the inner or central region 302 (shown in FIG. 3) more frequently than the outer regions 304, 306, 308 (shown in FIG. 3). For example, the region acquisition order may alternate between the inner region and each outer region in the order ABACADABACAD . . . and so on until the dynamic acquisition is complete.

At block 212, a view or acquisition order (e.g., a intra-region view order) is defined for the inner region 302 (shown in FIG. 3). The view order may be, for example, selected by a user or may be defined as part of the pulse sequence selected at block 202. In one embodiment, the view order for the inner region 302 is an elliptic centric view order 303 also shown in FIG. 3. In an alternative embodiment, the inner region 302 may optionally be partitioned into a plurality of fan beam segments at block 220 and the view order may be, for example, center-in, center-out or a combination of center-in/center-out. Other known view ordering schemes may be used for the inner region 302.

Figure 4:
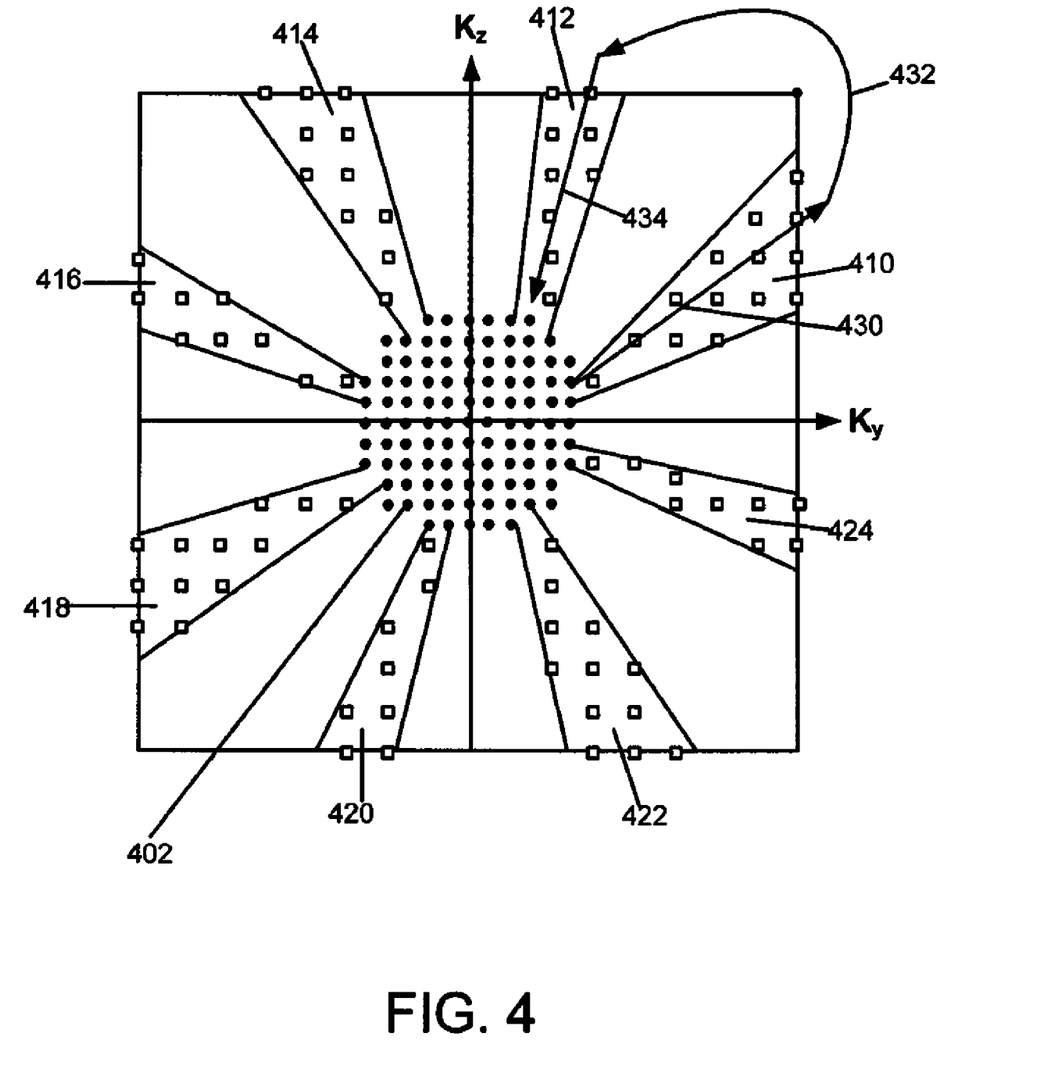
FIG. 4 is a schematic diagram showing a center-out/center-in view-ordering in accordance with an embodiment.

At block 214, a view or acquisition order (e.g., an intra-region view order) is defined for the outer regions 304, 306, and 308 (shown in FIG. 3). The view order may be, for example, selected by a user or may be defined as part of the pulse sequence selected at block 202. In one embodiment, the view order for each outer region may be a combination of center-out and center-in view orders. FIG. 4 is a schematic diagram showing a center-out/center-in view ordering in accordance with an embodiment. In FIG. 4, the inner region 402 and only one outer region, the first outer region ("B"), are shown for clarity. As mentioned, the first outer region is segmented into a plurality of fan beam segments 410-424. For the center-out/center-in acquisition scheme, views are acquired (or sampled or encoded) starting in a first fan beam segment 410. The acquisition starts with the lowest frequency views in the segment 410 nearest the inner region 402 and moving outward (as shown by arrow 430) such that the radial distance of the views from the origin of k-space increases with increasing time. After the views in the first fan beam segment 410 are acquired, the acquisition moves (or "jumps," as shown by arrow 432) to a second fan beam segment 412. In the second fan beam segment 412, views are acquired starting with the views farthest from the inner region 402 and moving inward (as shown by arrow 434) such that the radial distance of the views from the origin of k-space decreases with increasing time. Once the views in the second fan beam segment 412 are acquired, the acquisition moves to a third fan beam segment 414 for a center-out acquisition order and then to a fourth fan beam segment 416 for a center-in acquisition order and so on until the views of each of the fan beam segments 410-424 (and thus the views in the entire first outer region) have been acquired. Alternatively, a center-in/center-out combination may be used where the first segment of the outer region is acquired using a center-in order, the next segment is acquired using a center-out order and so on alternating between center-in and center-out orders on alternating segments.

Figure 5:
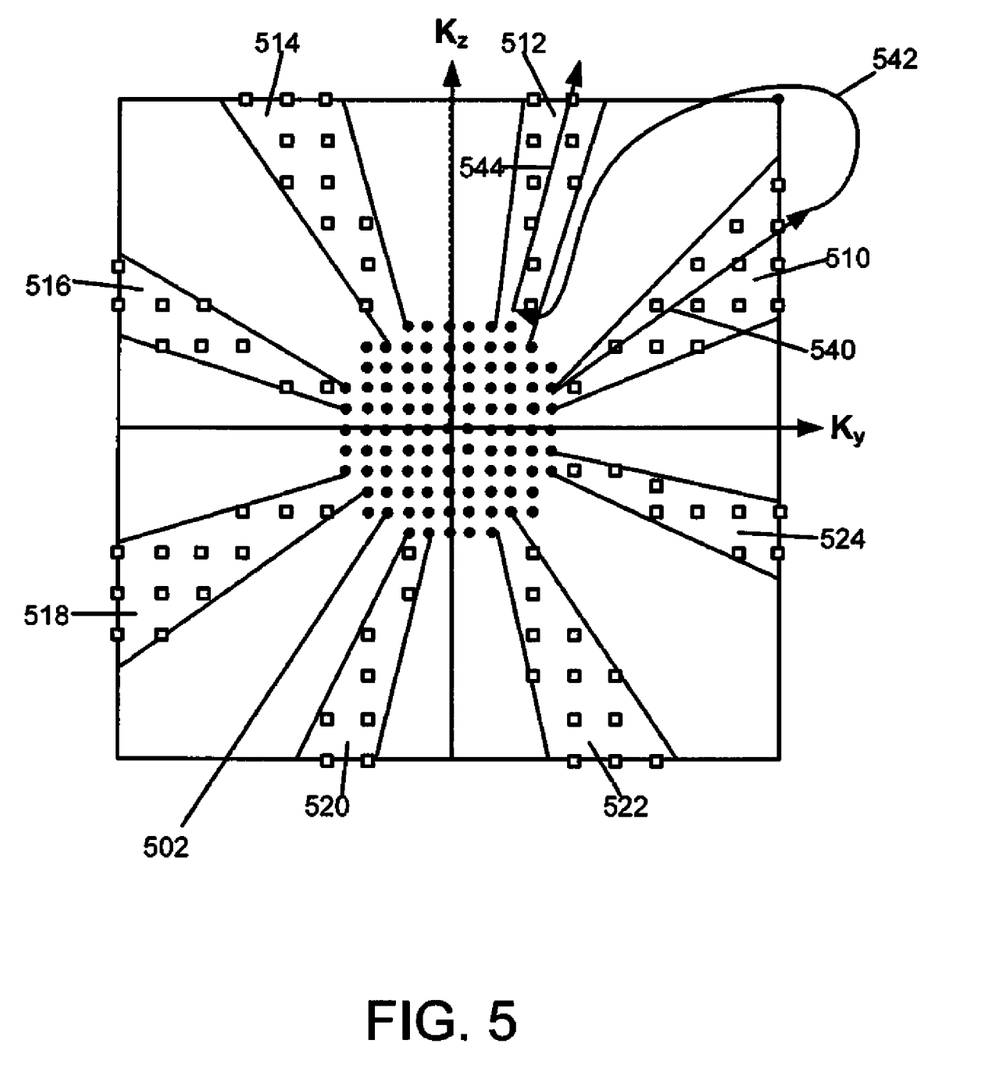
FIG. 5 is a schematic diagram showing a center-out view-ordering in accordance with an embodiment.

In another embodiment, the view order for each outer region 304, 306, 308 (shown in FIG. 3) may be a center-out view order. FIG. 5 is a schematic diagram showing a center-out view ordering in accordance with an embodiment. In FIG. 5, the inner region 502 and only one outer region, the first outer region ("B"), are shown for clarity. As mentioned, the first outer region is segmented into a plurality of fan beam segments 510-524. For the center-out acquisition scheme, views are acquired starting in a first fan beam segment 510. The acquisition starts with the lowest frequency views in the segment 510 nearest the inner region 502 and moving outward (as shown by arrow 540) such that the radial distance of the views from the origin of k-space increases with increasing time. After the views in the first fan beam segment 510 are acquired, the acquisition moves (or "jumps," as shown by arrow 542) to a second fan beam segment 512. In the second fan beam segment 512, views are also acquired in a center-out scheme starting with the lowest frequency views in the segment 512 nearest the inner region 502 and moving outward (as shown by arrow 544) such that the radial distance of the views from the origin of k-space increases with increasing time. Once all the views in the second fan beam segment 512 are acquired, the acquisition moves to a third fan beam segment 514 for center-out acquisition, then a fourth fan beam segment 516 for center-out acquisition and so on until the views of each of the fan beam segments 510-524 of the outer region have been acquired.

Figure 6:
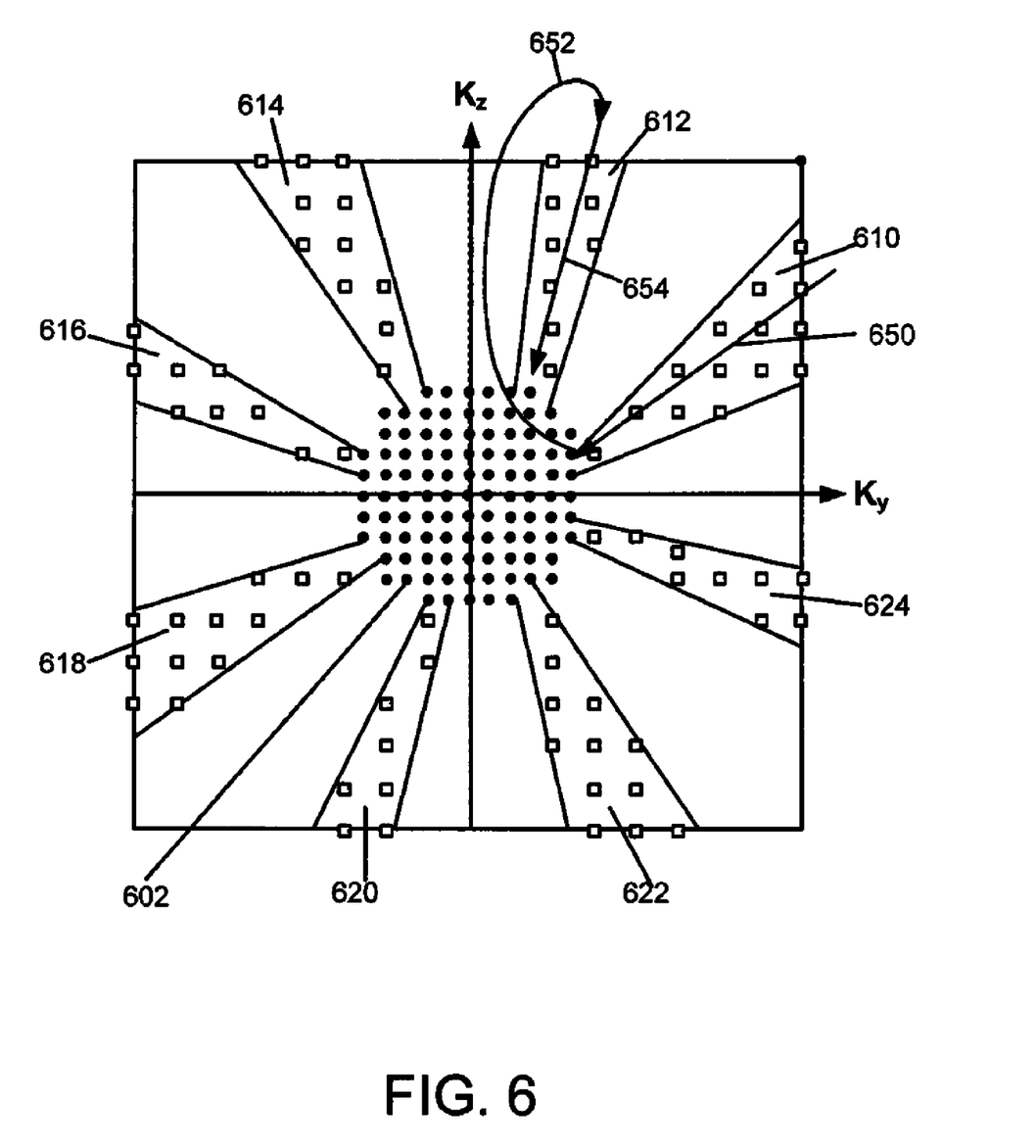
FIG. 6 is a schematic diagram showing a center-in view-ordering in accordance with an embodiment.

In yet another embodiment, the view order for each outer region 304, 306, 308 (shown in FIG. 3) may be a center-in view order. FIG. 6 is a schematic diagram showing a center-in view ordering in accordance with an embodiment. In FIG. 6, the inner region 602 and only one outer region, the first outer region ("B"), are shown for clarity. As mentioned, the first outer region is segmented into a plurality of fan beam segments 610-624. For the center-in acquisition scheme, views are acquired starting in a first fan beam segment 610. The acquisition starts with the views farthest from the inner region 602 and moving inward (as shown by arrow 650) such that the radial distance of the views from the origin of k-space decreases with increasing time. After the views in the first fan beam segment 610 are acquired, the acquisition moves (or "jumps," as shown by arrow 652) to a second fan beam segment 612. In the second fan beam segment 612, views are also acquired in a center-in scheme starting with the highest frequency views in the segment 612 farthest from the inner region 602 and moving inward (as shown by arrow 654) such that the radial distance of the views from the origin of k-space decreases with increasing time. Once all the views in the second fan beam segment 612 are acquired, the acquisition moves to a third fan beam segment 614 for center-out acquisition, then a fourth fan beam segment 616 for center-out acquisition and so on until the views of each of the fan beam segments 610-624 of the region have been acquired.

Returning to FIG. 2, as described above with respect to block 210, the inner region and outer regions are acquired in an alternating acquisition order so that the views in the inner region are acquired more frequently than the views in the outer region. The view orders for the inner and outer regions can also be configured to reduce or eliminate the jumps between an outer region to the inner region. In one embodiment, the inner region may be acquired using an elliptic centric scheme and then the first fan beam segment of an outer region acquired using a center-out traverse. The remaining fan beam segments of the outer regions are acquired alternating between a center-in traverse and a center-out traverse so that the last fan beam segment is a center-in traverse which results in a minimal jump to the center of k-space in the inner region when the next inner region is acquired. In another embodiment, when the acquisition moves from an outer region to the inner region, the first N views in the inner region are acquired in a center-in fashion along a specific radial line in continuation from where the last view in the last segment of the outer region was acquired. The remaining views if the inner region may be acquired using an elliptic centric view order. In yet another embodiment, if the inner region is partitioned into a plurality of fan beam segments at block 220, the inner region can be acquired staring with a center-in traverse and then alternating between center-out and center-in traverses on alternating fan beam segments.

At block 216, MRI data is acquired (e.g., using an MRI system 10, shown in FIG. 1) in accordance with at least the selected pulse sequence, the acquisition order determined at block 210, the view ordering for the inner region determined at block 212 and the view ordering for the outer regions determined at block 214. The alternating acquisition order from block 210 of the inner and outer regions continues until the acquisition is complete. In one embodiment, for a contrast acquisition, all of the regions (A-D) may be scanned (e.g., a mask acquisition) before the contrast is injected and before the alternating acquisition for the dynamic study. Once the MR data is acquired, it may be stored in memory and used to reconstruct at least one image at block 218 using known image reconstruction techniques.

The method described above is compatible with various techniques used to further reduce acquisition time (or scan time) such as parallel imaging, self-calibrated parallel imaging, or homodyne reconstruction techniques. In addition, as mentioned above, the method is compatible with rectangular and non-rectangular (e.g., corner removal) k-space coverage.

A technical effect of the disclosed method and apparatus is minimizing eddy current induced artifacts in reconstructed MR images for a dynamic or time-resolved study or acquisition.

Computer-executable instructions for acquiring three-dimensional MR data for a dynamic study according to the above-described method may be stored on a form of computer readable media. Computer readable media includes volatile and nonvolatile, removable and non-removable media implemented in any method or technology for storage of information such as computer readable instructions, data structures, program modules or other data. Computer readable media includes, but is not limited to, random access memory (RAM), read-only memory (ROM), electrically erasable programmable ROM (EEPROM), flash memory or other memory technology, compact disk ROM (CD-ROM), digital versatile disks (DVD) or other optical storage, magnetic cassettes, magnetic tape, magnetic disk storage or other magnetic storage devices, or any other medium which can be used to store the desired instructions and which may be accessed by MRI system 10 (shown in FIG. 1), including by internet or other computer network forms of access.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

We claim:

1. A method for acquiring magnetic resonance (MR) data for a three-dimensional (3D) dynamic study, the method comprising:
    partitioning, a $k_y$-$k_z$ plane comprising a plurality of views into an inner region and a plurality of outer regions, the inner region comprising a set of views in a central region of the $k_y$-$k_z$ plane and each outer region comprising a plurality of views outside of the central region of the $k_y k_z$ plane;
    partitioning each outer region into a plurality of radial fan beam segments;
    defining a first view ordering for the inner region;
    defining a second view ordering for each outer region;
    acquiring MR data, using a magnetic resonance imaging system, for the set of views in the inner region and for all of the views in each of the outer regions in an alternating acquisition order comprising acquiring the set of views in the inner region more frequently than the views in each of the outer regions, and
    generating at least one MR image based on the acquired MR data; and
    displaying the MR image on a display device.

2. A method according to claim 1, wherein the first view ordering for the inner region is an elliptic centric view ordering.

3. A method according to claim 1, wherein the second view ordering for each outer region is a combination of a center-out and center-in view ordering.

4. A method according to claim 3, wherein acquiring all of the views in an outer region comprises acquiring the plurality of radial fan beam segments by alternating between a center-out view ordering and a center-in view ordering on alternating radial fan beam segments.

5. A method according to claim 1, wherein the second view ordering for each outer region is a center-in view ordering.

6. A method according to claim 1, wherein the second view ordering for each outer region is a center-out view ordering.

7. A method according to claim 1, wherein the alternating acquisition order comprises alternating acquisition of the inner region with each of the outer regions.

8. A method according to claim 1, further comprising partitioning the inner region into a plurality of radial fan beam segments.

9. A method according to claim 1, wherein partitioning each outer region into a plurality of radial fan beam segments further comprises:
    partitioning a first outer region into a first plurality of radial fan beam segments; and
    partitioning a second outer region into a second plurality of radial fan beam segments that are interleaved between the first plurality of fan beam segments.

10. A non-transitory computer readable medium having computer executable instructions for performing a method for acquiring magnetic resonance (MR) data for a three-dimensional (3D) dynamic study, the computer readable medium comprising:
    program code for partitioning a $k_y$-$k_z$ plane comprising a plurality of views into an inner region and a plurality of outer regions, the inner region comprising a set of views in a central region of the $k_y$-$k_z$ plane and each outer region comprising a plurality of views outside of the central region of the $k_y$-$k_z$ plane;

program code for partitioning each outer region into a plurality of radial fan beam segments;

program code for defining a first view ordering for the inner region;

program code for defining a second view ordering for each outer region;

program code for acquiring MR data for the set of views in the inner region and for all of the views in each of the outer regions in an alternating acquisition order comprising acquiring the set of views in the inner region more frequently than the views in each of the outer regions; and program code for generating at least one MR image based on the acquired MR data.

11. A non-transitory computer readable medium according to claim 10, wherein the first view ordering for the inner region is an elliptic centric view ordering.

12. A non-transitory computer readable medium according to claim 10, wherein the second view ordering for each outer region is a combination of a center-out and center-in view ordering.

13. A non-transitory computer readable medium according to claim 12, wherein the program code for acquiring all the views in an outer region comprises program code for acquiring the plurality of radial fan beam segments by alternating between a center-out view ordering and a center-in view ordering on alternating radial fan beam segments.

14. A non-transitory computer readable medium according to claim 10, wherein the second view ordering for each outer region is a center-in view ordering.

15. A non-transitory computer readable medium according to claim 10, wherein the second view ordering for each outer region is a center-out view ordering.

16. An apparatus for acquiring magnetic resonance (MR) data for a three-dimensional (3D) dynamic study, the apparatus comprising:

a magnetic resonance imaging assembly comprising a magnet, a plurality of gradient coils, at least one radio frequency coil, a radio frequency transceiver system and a pulse generator module; and a controller coupled to the magnetic resonance imaging assembly and programmed to control the magnetic resonance imaging assembly to acquire magnetic resonance data using a 3D pulse sequence, the controller further programmed to:

partition a $k_y$-$k_z$ plane comprising a plurality of views into an inner region and a plurality of outer regions, the inner region comprising a set of views in a central region of the $k_y$-$k_z$ plane and each outer region comprising a plurality of views outside of the central region of the $k_y$-$k_z$ plane;

partition each outer region into a plurality of radial fan beam segments; define a first view ordering for the inner region;

define a second view ordering for each outer region;

provide commands to the magnetic resonance imaging assembly to acquire MR data for the set of views in the inner region and for all of the views in each of the outer regions;

encode the MR data for the set of views in the inner region and the views in each of the outer regions in an alternating acquisition order comprising acquiring the set of views in the inner region more frequently than the views in each of the outer regions, and generate at least one MR image based on the acquired MR data.

17. An apparatus according to claim 16, wherein the first view ordering for the inner region is an elliptic centric view ordering.

18. An apparatus according to claim 16, wherein the second view ordering for each outer region is a combination of a center-out and center-in view ordering.

19. An apparatus according to claim 18, wherein acquiring all of the views in an outer region comprises acquiring the plurality of radial fan beam segments by alternating between a center-out view ordering and a center-in view ordering on alternating radial fan beam segments.

20. An apparatus according to claim 16, wherein the second view ordering for each outer region is a center-in view ordering.

21. An apparatus according to claim 16, wherein the second view ordering for each outer region is a center-out view ordering.

* * * * *